(12) United States Patent
Stemmer et al.

(10) Patent No.: US 7,482,806 B2
(45) Date of Patent: Jan. 27, 2009

(54) MULTI-COIL MAGNETIC RESONANCE DATA ACQUISITION AND IMAGE RECONSTRUCTION METHOD AND APPARATUS USING BLADE-LIKE K-SPACE SAMPLING

(75) Inventors: Alto Stemmer, Erlangen (DE); Vladimir Jellus, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 108 days.

(21) Appl. No.: 11/633,894

(22) Filed: Dec. 5, 2006

(65) Prior Publication Data

US 2008/0129289 A1    Jun. 5, 2008

(51) Int. Cl.
*G01V 3/00* (2006.01)
(52) U.S. Cl. .................................... 324/307
(58) Field of Classification Search ............ 324/307
See application file for complete search history.

(56) References Cited

U.S. PATENT DOCUMENTS

| | | | |
|---|---|---|---|
| 6,882,148 B2* | 4/2005 | Pipe | 324/307 |
| 7,309,984 B2* | 12/2007 | Arunachalam et al. | 324/307 |
| 2006/0028206 A1* | 2/2006 | Zhang et al. | 324/309 |
| 2006/0232273 A1* | 10/2006 | Takizawa et al. | 324/309 |
| 2007/0219740 A1* | 9/2007 | Wilson et al. | 702/85 |
| 2008/0068016 A1* | 3/2008 | Gaddipati et al. | 324/318 |

* cited by examiner

*Primary Examiner*—Diego Gutierrez
*Assistant Examiner*—Megann E Vaughn
(74) *Attorney, Agent, or Firm*—Schiff Hardin LLP (57) ABSTRACT

In a data acquisition and reconstruction method for magnetic resonance (MR) tomography, and a corresponding MR tomography apparatus, a blade-like sampling of k-space according to the PROPELLER method using a number of reception coils ensures with partial under-sampling of at least one blade of k-space such that the under-sampling ensues by regular omission of k-space lines in both boundary regions (with regard to the phase-encoding direction $k_y$) of a blade such that only data in each A-th line of said boundary regions are acquired; with no k-space lines being omitted in the central region (with regard to the $k_y$-direction) and thus at least one coil calibration line is obtained, selection of a suitable PPA method for completion of the blades and determination of the necessary coil calibration data necessary for the PPA reconstruction of a partial under-sampled blade from the central completely sampled region of said blade. PPA reconstruction via application of the selected PPA method selected in order to interpolate the non-measured or, respectively, omitted k-space lines of each blade, and execution of the PROPELLER reconstruction after the PPA reconstruction.

13 Claims, 7 Drawing Sheets

WITHOUT MOVEMENT CORRECTION

WITH MOVEMENT CORRECTION

FIG 7

MULTI-COIL MAGNETIC RESONANCE DATA ACQUISITION AND IMAGE RECONSTRUCTION METHOD AND APPARATUS USING BLADE-LIKE K-SPACE SAMPLING

BACKGROUND OF THE INVENTION

1. Field of the Invention

The present invention generally concerns magnetic resonance tomography (MRT) as used in medicine for examination of patients. The present invention in particular concerns methods for accelerated and improved (with regard to the signal-to-noise ratio (SNR) image generation from raw data that are or have been acquired with a type of technique known as the PROPELLER technique. A number of reception coils are necessary in order to use this technique.

2. Description of the Prior Art

The conventional PROPELLER technique is a radial sampling (scanning) method in MRT imaging and is briefly described as follows. A more detailed presentation can be found in the article of the magazine Magnetic Resonance in Medicine 42: 963-969 (1999) by James G. Pipe. In the PROPELLER technique, sampling of k-space ensues on the basis of a series of blades. Each of the blades is composed of L equidistant, parallel phase coding lines. A blade thus contains the L lines of a conventional k-space trajectory with Cartesian sampling for which the phase coding gradient has the smallest amplitude. The k-space sampling according to the PROPELLER technique is dependent on the manner that the individual blades of the series are rotated relative to one another around the center of k-space. The rotation angle $\alpha_i$ and the number N of the total number of blades are characteristic parameters that are selected such that the series covers or overlaps the entire k-space of interest (see FIG. 2). A significant feature of the PROPELLER k-space trajectory is that a circular region (with diameter L) in the center of k-space is covered by every single blade. As a result, in comparison to other acquisition methods in MRT, the PROPELLER technique is extremely robust with regard to patient movement during the data acquisition. The comparison of two different blades with regard to this center data enables movements of the patient in the image plane that occur between the acquisition of two blades to be determined. This movement can then be corrected in the framework of the PROPELLER image reconstruction. The comparison of the center data also enables the identification of such blades that can not/could not be movement-corrected (in particular given patient movement out of the image plane) and exclusion thereof from the image reconstruction.

The assumption forming the basis of the PROPELLER movement correction is that each blade is separately sampled quickly with regard to typical patient movements, such that any movement is frozen.

It is known that an acceleration of the method (the data acquisition) in MRT can generally be achieved by PPA (partial parallel acquisition). In Cartesian imaging, data acquisition with PPA methods enables one or more k-space lines to be excluded in the phase coding direction and for the missing information (the missing lines) to be algebraically reconstructed afterwards from the measured lines. A number of reception coils (for example a multi-component coil array of surface coils) are a requirement for this, and the respective spatial sensitivity of each coil must be known. The spatial sensitivity depends on, among other things, the orientation of the coil on the patient and the respective load in the receptive field (this depends on the patient himself or herself).

The determination of the coil sensitivities (or generally the determination of data known as coil calibration data) is therefore a component of every PPA technique.

The omission of lines does in fact lead to a significant reduction of the acquisition time, but at the cost of a notable SNR decrease and thus a lower image quality.

In the technical literature a number of different PPA methods are described. Peter Kellman, "Parallel Imaging: The Basics", ISMRM Educational Course: MR Physics for Physicists, 2004 gives an overview. A specific PPA method that is applied in the embodiment of the present invention is GRAPPA. GRAPPA was first described in the journal article by Mark A. Griswold, Peter M. Jakob, Robin M. Hidemann, Mathias Nittka, Vladimir Jellus, Jianmin Wang, Berthold Kiefer, Axel Haase, "Generalized Autocalibrating Partially Parallel Acquisitions (GRAPPA)", Magn. Reson. Med., 47: 1202-1210, 2002. The embodiment of the present invention also currently supports further developments of GRAPPA. These developments of GRAPPA are, for example, described by E. G. Kholmovski, A. A. Samsonov in "GARSE: Generalized Autocalibrating Reconstruction for Sensitivity Encoded MRI", ISMRM 2005, abstract #2672. In the work (cited above) by E. G. Kholmovski, A. A. Samsonov, the further-developed GRAPPA method is given the new name "GARSE".

The acquisition time of PROPELLER MRI can be significantly shortened by PPA methods (for example see James G. Pipe, "The use of Parallel Imaging with PROPELLER DWI", ISMRM 2003, abstract #66.

Figure 3:
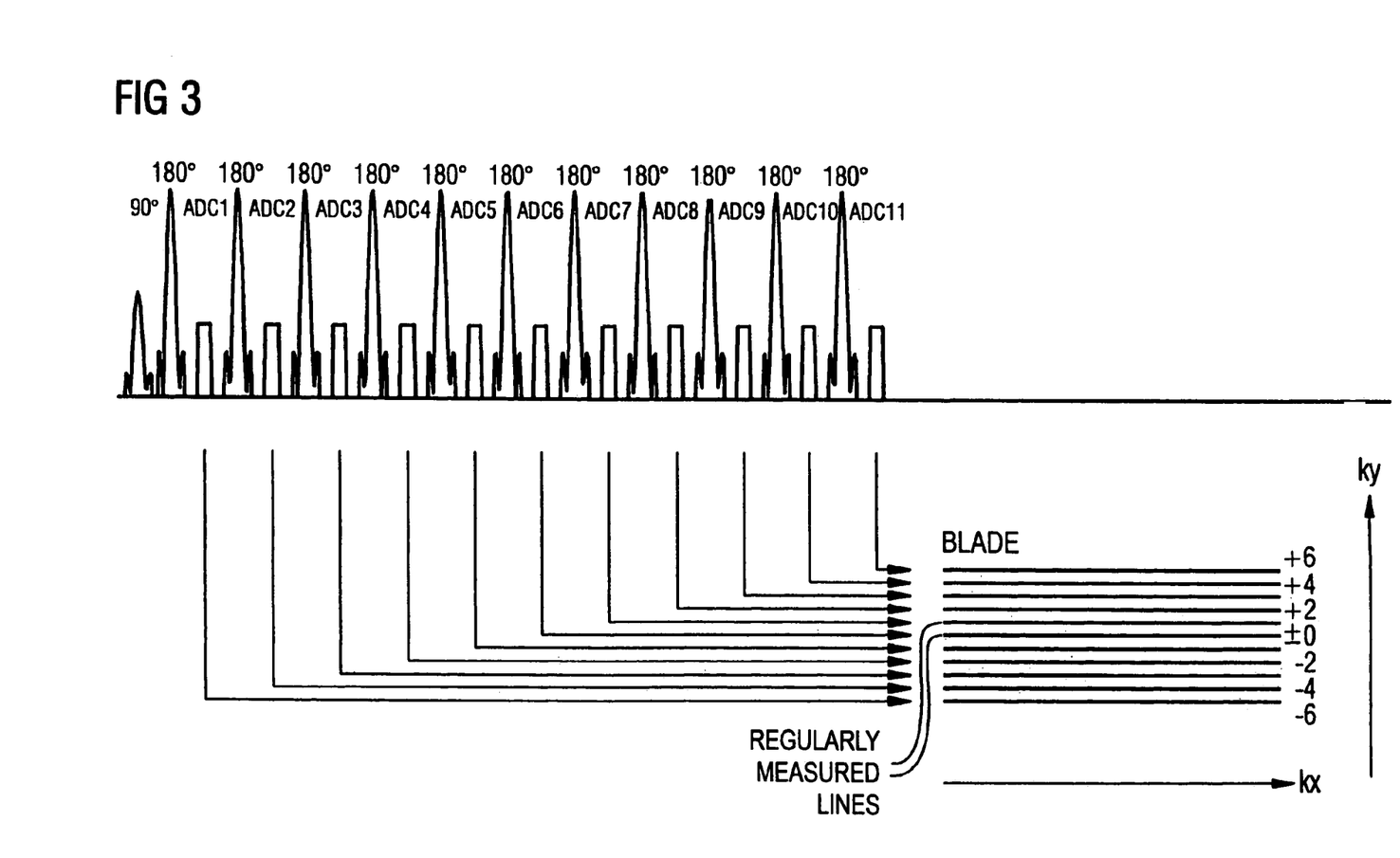
FIG. 3 schematically shows the filling of an L=11-line blade in the framework of a conventional, non-accelerated 11 echo TSE PROPELLER sequence.
Figure 4:
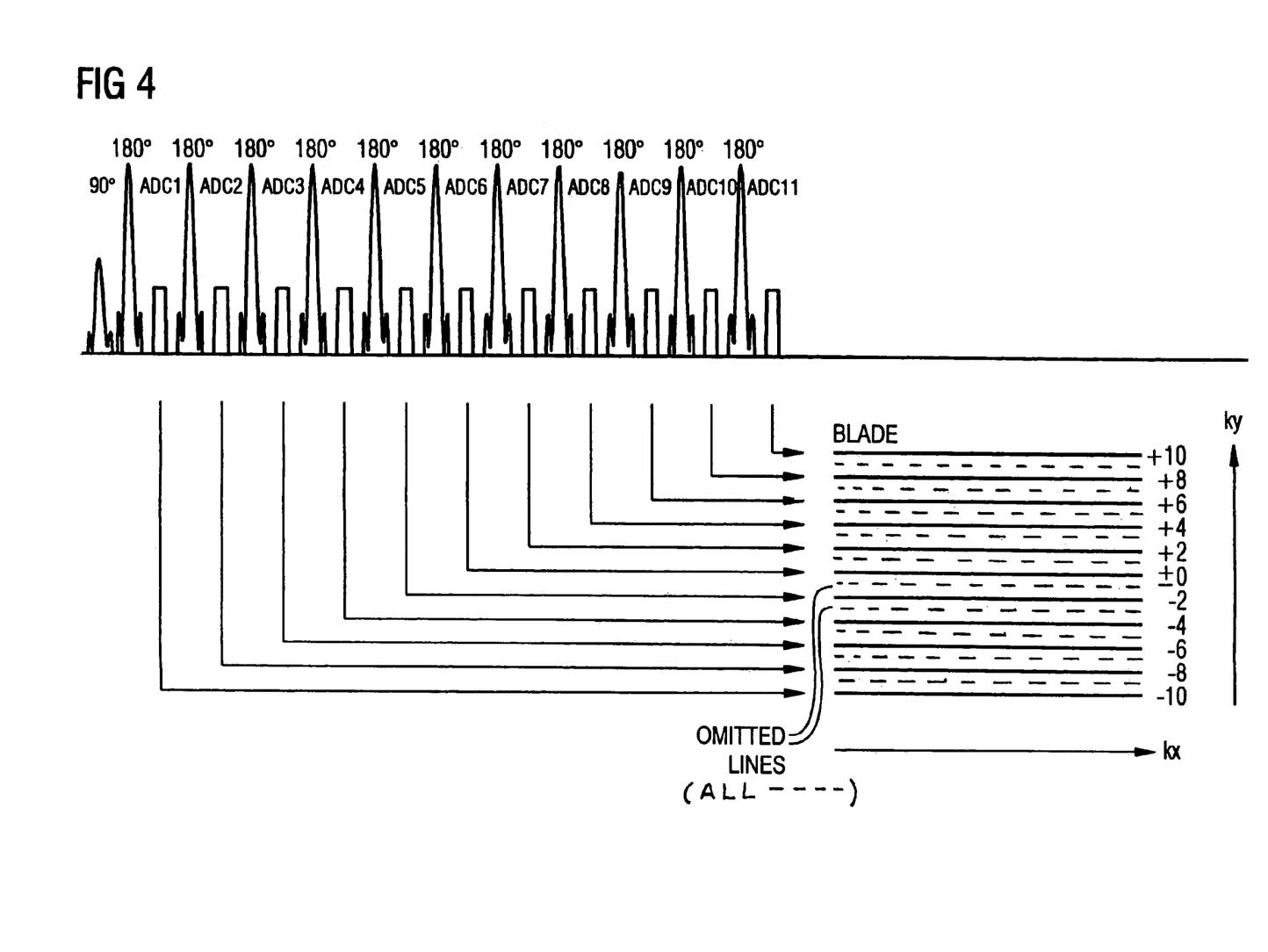
FIG. 4 schematically shows the filling of an L=21-line blade in the framework of an 11 echo TSE PROPELLER sequence in combination with a PPA acquisition method according to the prior art.

Common to all previous PPA-PROPELLER implementations is the selection of the blade width (the number of the lines in a blade), which corresponds to A times the width of a conventional scan and such that only data in each A-th line are acquired during the data acquisition (see FIGS. 3 and 4); each blade thus falls below the Nyquist criterion by the A-multiple. A is thereby generally designated as an acceleration factor. In order to avoid aliasing as a result of the under-sampling of the respective blade, a PPA reconstruction is individually applied to each blade before the actual PROPELLER reconstruction. The actual PROPELLER reconstruction then corresponds to the reconstruction method from conventional (non-accelerated) PROPELLER and is described in the journal article by James Pipe (cited previously). It typically includes the steps of phase correction, rotation correction, displacement correction, correlation weighting, interpolation on a Cartesian grid and final Fourier transformation. Optionally, some of these steps can be omitted (for example the correlation weighting).

Two different techniques for determination of the coil sensitivities required for PPA reconstruction are specified in the literature:

The first technique is to estimate the coil sensitivities on the basis of a conventional PROPELLER scan separately applied for this. This technique is applied, for example, by T-C. Chuang, T-Y. Huang, F-H. Linear, F-N. Wang, H-W. Chung, C-Y. Chen, K. Wong in "Propeller EPI with SENSE parallel imaging using a circularly symmetric phase array RF coil", ISMRM 2004, abstract #535.

The second technique includes the estimation of the coil sensitivities on the basis of the central k-space zone (common to all blades) with diameter L. In order to obtain the coil calibration data for the PPA reconstruction of a specific blade, the central data of all blades are interpolated on the grid of this blade (using what is known as a gridding algorithm). This method is based on the assumption that the central k-space zone is sampled by all blades according to the Nyquist criterion. This assumption is correct only for acceleration factors that are not too large. If no patient movement occurs during the measurement and if the requirement cited for the second technique is fulfilled, both techniques are suitable for the determination of the coil sensitivities.

If a significant movement of the patient ensues during the actual measurement, however, the relation of the coil calibration data to the respective blades is lost since the PPA reconstruction occurs before a movement correction (rotation, displacement).

In such a case, measurement data of different blades are intermixed by the PPA reconstruction method and movement artifacts are thereby generated, and in fact also when each individual blade is separately measured quickly relative to typical patient movement. This is a significant, severe disadvantage in comparison to the conventional PROPELLER imaging in MRT and stands in contradiction to the fundamental assumption that each blade is essentially free of any movement effects.

It should be noted that it is not possible to implement a movement correction before the PPA reconstruction, since a movement registration cannot be applied to under-sampled blades.

SUMMARY OF THE INVENTION

An object of the present invention is to provide an improved acquisition and reconstruction method in the framework of the PROPELLER imaging technique, which method among other things avoids disadvantages of the existing methods and moreover leads to a better SNR.

This object is achieved according to the present invention by a method for acquisition and reconstruction in magnetic resonance tomography with a blade-like sampling of k-space according to the PROPELLER method using a number of reception coils that includes the following steps:

(S1) partial under-sampling of at least one blade of k-space such that the under-sampling ensues by regular omission of k-space lines in both boundary regions (with regard to the phase encoding direction $k_y$) of a blade such that only data in each A-th line of said boundary regions are acquired; with no k-space lines being omitted in the central region (with regard to the $k_y$-direction) and thus at least one coil calibration line (but generally multiple coil calibration lines) is/are obtained, (S2) selection of a suitable PPA method for completion of the blades and determination of the necessary coil calibration data necessary for the PPA reconstruction of a particular partial under-sampled blade from the central completely sampled region of said blade, (S3) PPA reconstruction by application of the PPA method selected in (S2) in order to interpolate the non-measured or omitted k-space lines of each blade, (S4) execution of the PROPELLER reconstruction after the PPA reconstruction.

The PPA method in steps (S2) and (S3) is preferably GRAPPA or a PPA method (for example GARSE) derived therefrom.

An optimized solution of the linear equation system defined by GRAPPA/GARSE is likewise obtained with a combination from SVD methods and regularization theory.

In a possible embodiment of the invention, to accelerate the GRAPPA/GARSE reconstruction method the number of the equations of the linear GRAPPA/GARSE equation system to be solved is reduced such that measurement points whose $k_x$ magnitude value exceeds a threshold $k_{max}$ according to $|k_x|>k_{max}$ are excluded from the GRAPPA/GARSE reconstruction method, with $k_{max}$ defined such that the GRAPPA/GARSE equation system is at least over-determined.

In a further possible embodiment of the invention, for acceleration of the PPA reconstruction coils that supply little signal contribution (SNR) are excluded from the reconstruction method on the basis of an algorithm.

An algorithm for determination of the coils to be excluded in accordance with the invention can exhibit the following steps:

measurement of a correlation $$cc_i = \sum_{k_y}\sum_{k_y} s_i^*(k_y, k_x) s_i(k_y, k_x)$$

for each coil, with the respective blade being summed over all points of the central, completely-sampled region (or a sub-region of this region), determination of the coil that, of all correlation measurements according to $$cc_{max} = \max_{i=1}^{N_c} cc_i,$$

has the largest value, with $N_c$ as a coil count, and exclusion from the GRAPPA/GARSE reconstruction method of that/those component coil(s) whose correlation measurement(s) satisfies/satisfy the following inequality:

$$\sqrt{\frac{cc_i}{cc_{max}}} < \eta,$$

with $\eta=(0\leq\eta<1)$ as an adjustable threshold.

The above object also is achieved in accordance with the invention by a method for improvement of the SNR in PPA-based magnetic resonance tomography imaging given use of the GRAPPA/GARSE reconstruction method, in which the solution of the linear equation system obtained by GRAPPA/GARSE is obtained with a combination from SVD methods and regularization theory.

The above object also is achieved in accordance with the invention by a magnetic resonance tomography apparatus for implementation of the above-described method and all embodiments thereof.

DESCRIPTION OF THE PREFERRED EMBODIMENTS

Figure 1:
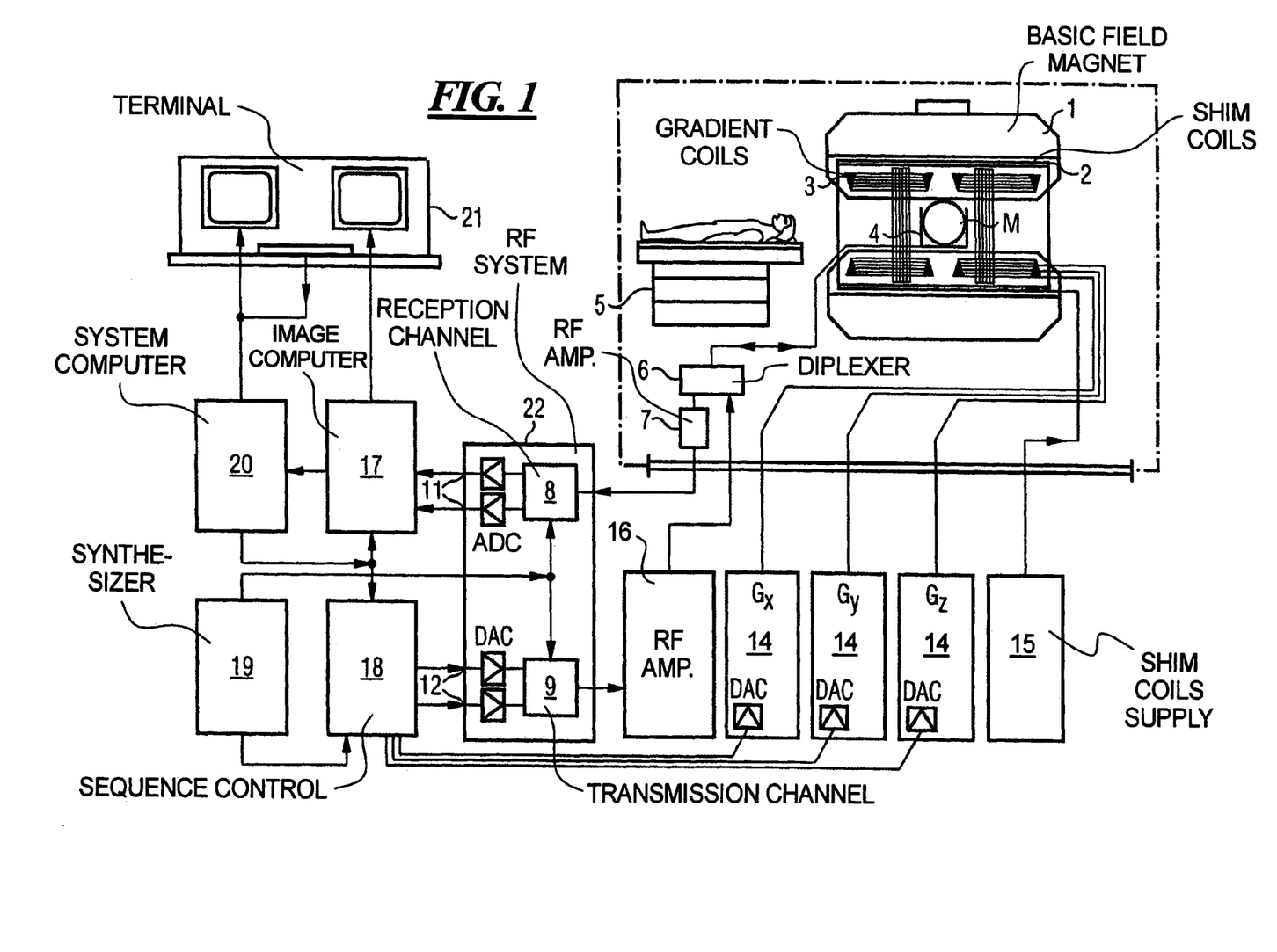
FIG. 1 schematically shows a magnetic resonance tomography apparatus according to the present invention.

FIG. 1 schematically illustrates an inventive magnetic resonance imaging (tomography) apparatus for generation MRT images of a subject with the PROPELLER technique on the basis of an image reconstruction method according to the present invention. A basic field magnet 1 generates a temporally constant strong magnetic field for polarization or alignment of the nuclear spins in the examination region of a subject (such as, for example, of a part of a human body to be examined). The high homogeneity of the basic field magnet that is required for the magnetic resonance data acquisition defined in a (typically spherical) measurement volume M into which the parts of the human body to be examined are introduced. To support the homogeneity requirements, and in particular for elimination of temporally invariable influences, shim plates made from ferromagnetic material are mounted at a suitable location. Temporally-variable influences are eliminated by shim coils 2 that are activated by a shim power supply 15.

A cylindrical gradient coil system 3 that has three sub-windings is used in the basic field magnet 1. Each sub-winding is supplied with current from an amplifier for generation of a linear gradient field in the respective direction of the Cartesian coordinate system. The first sub-winding of the gradient field system 3 thereby generates a gradient $G_x$ in the x-direction, the second sub-winding generates a gradient $G_y$ in the y-direction and the third sub-winding generates a gradient $G_z$ in the z-direction. Each amplifier has a digital-analog converter that is activated by a sequence controller 18 for time-accurate generation of gradient pulses.

Located within the gradient field system 3 is a radio-frequency antenna 4 that converts the radio-frequency pulses emitted by a radio-frequency power amplifier into an alternating magnetic field for excitation of the nuclei and alignment of the nuclear spins of the subject to be examined or of the region of the subject to be examined. The radio-frequency antenna 4 comprises one or more RF transmission coils and a number of RF reception coils in the form of an annular, linear or matrix-like arrangement of component coils. The alternating field originating from the precessing nuclear spins (normally the nuclear spin echo signals caused by a pulse sequence composed of one or more radio-frequency pulses and one or more gradient pulses) is converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. The real part and the imaginary part of this number series are respectively supplied via inputs 12 to a digital-analog converter in the radio-frequency system 22 and from this to a transmission channel 9. In the transmission channel 9, the pulse sequences are modulated on a radio-frequency carrier signal having a base frequency corresponding to the resonance frequency of the nuclear spins in the measurement volume.

The switch-over from transmission mode to reception mode ensues via a transmission-reception diplexer 6. The RF transmission coil of the radio-frequency antenna 4 radiates the radio-frequency pulses for excitation of the nuclear spins into the measurement volume M and the resulting echo signals are detected by the RF reception coils. The acquired magnetic resonance signals are phase-sensitively demodulated on an intermediate frequency in the reception channel 8' (first demodulator) of the radio-frequency system 22 and digitized in the analog-digital converter (ADC). This signal must be demodulated at the frequency 0. The demodulation at frequency 0 and separation into real part and imaginary part occurs after the digitization in the digital domain in a second demodulator 8. An image is reconstructed by an image computer 17 from the measurement data so acquired. The administration of the measurement data, the image data and the control programs ensues via the system computer 20. By the execution of control programs, the sequence controller 18 monitors the generation of the respective desired pulse sequences and the corresponding sampling of k-space. The sequence controller 18 in particular controls the time-accurate switching of the gradients, the emission of the radio-frequency pulses with defined phase and amplitude and the reception of the nuclear magnetic resonance signals. The time base for the radio-frequency system 22 and the sequence controller 18 is provided by a synthesizer 19. The selection of corresponding control programs for generation of a nuclear magnetic resonance image as well as the representation of the generated nuclear magnetic resonance image ensues via a terminal 21 that has a keyboard as well as one or more screens.

The present invention represents an improved alternative relative to the image acquisition and reconstruction methods with the PROPELLER technique described in the introduction. The inventive method is essentially implemented by the sequence controller 18 and the image computer 17 of the nuclear magnetic resonance tomography apparatus described above.

The inventive method is based on the insight that, by the acquisition of additional k-space lines in the central region of a blade, all data that are used in the PPA reconstruction of the blade are acquired in a time interval that is short relative to typical patient movements. This is explained in detail in the following.

In an embodiment of the present invention, all data necessary for a PPA reconstruction of each blade are acquired by a single echo train of a turbo spin echo (TSE) sequence. This is shown in the example of a TSE echo train with 11 echoes in FIG. 5. A sampling of only each A-th line ensues at the periphery of the blade (at the edges of the blade in the phase coding direction) corresponding to a PPA-PROPELLER imaging according to the prior art. However, in contrast to the prior art the central region of the blade is completely acquired, meaning that no k-space lines are omitted there. Thus, no under-sampling thus ensues in this region.

Figure 5:
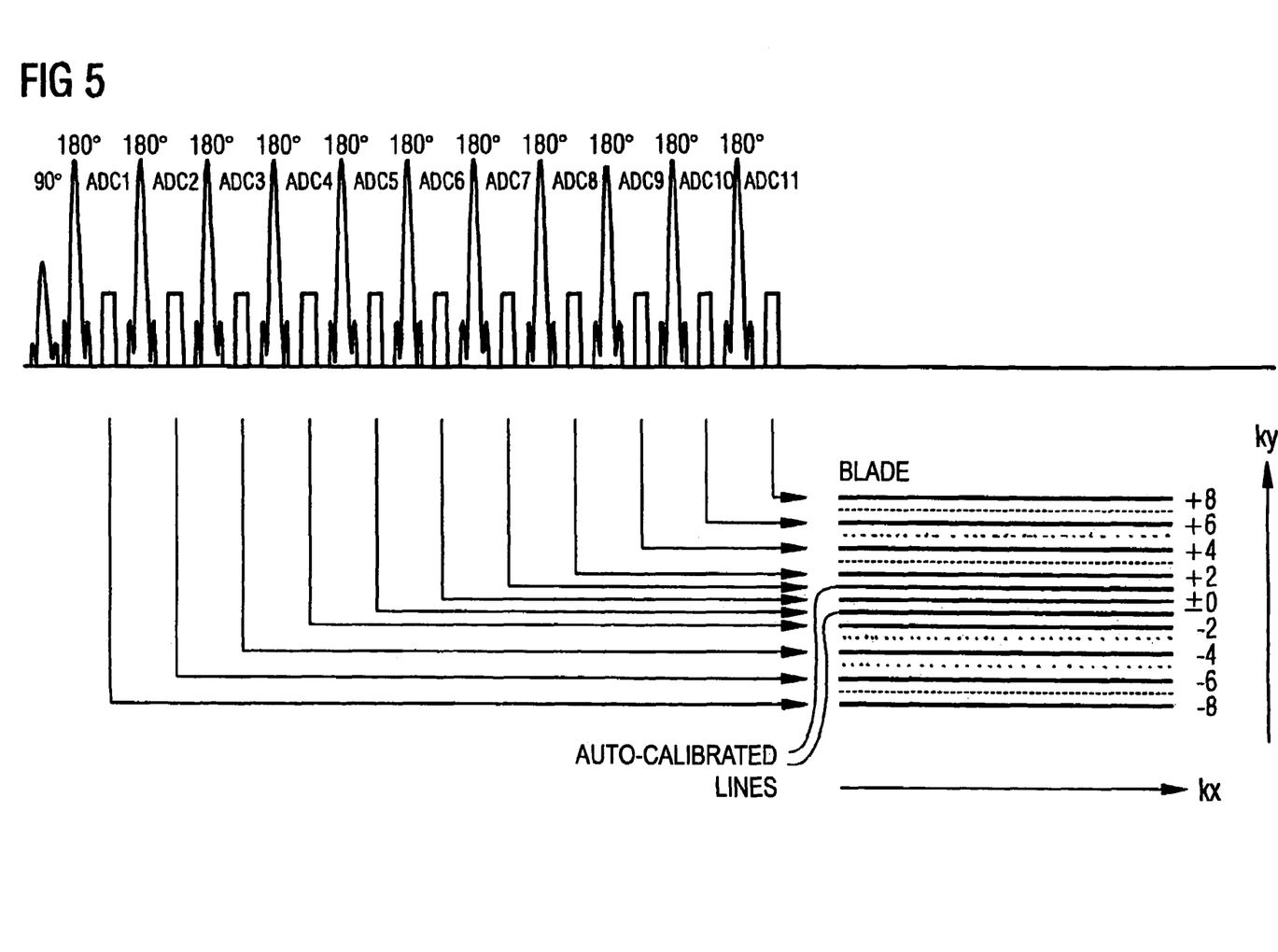
FIG. 5 schematically shows the filling of an L=17-line blade in the framework of an 11 echo TSE PROPELLER sequence in combination with an inventive PPA acquisition method.

The data of this completely-sampled region are used in PPA reconstruction as coil calibration data. For example, for each coil low-resolution images can thus be calculated that are then ultimately used for determination of the respective coil sensitivities. For the PPA method GRAPPA/GARSE used in the embodiment of the present invention, the coil calibration data are used directly (as is explained in more detail later) such that an explicit calculation of the coil sensitivities is not necessary.

The underlying idea of this procedure is known as "auto-calibration technique" or "self-calibration" in connection with conventional Cartesian PPA methods.

The main advantage of the inventive method is that (in contrast to conventional PPA-PROPELLER techniques) all data that are necessary for the PPA reconstruction of a single blade are acquired in succession and at the same time as for a corresponding (far narrower) blade sampled in a non-accelerated manner with an equal number of sampled (i.e. actually measured) values. The application possibility of a movement compensation (movement correction) corresponding to the conventional PROPELLER imaging is thus not lost.

The advantages of the conventional PPA-PROPELLER technique relative to the conventional non-accelerated PROPELLER technique are thereby retained:

1) If the number of the actually-measured lines and all other measurement parameters are retained relative to the conventional, non-accelerated PROPELLER technique, the width of a single blade thus increases relative to the conventional, non-accelerated PROPELLER technique. Fewer blades are therefore required in order to sufficiently cover k-space. The minimum required total measurement time is thereby shortened.

2) If the assumptions made under 1) are valid, the diameter of the section circle (circular section area of the single blade in the k-space center) forming the basis of a movement correction increases. The precision of the movement correction thereby also increases in comparison to the conventional, non-accelerated PROPELLER imaging.

3) Similar to as in the conventional PPA-PROPELLER technique, it is alternatively also possible to select the blade width equal to the blade width of the conventional, non-accelerated PROPELLER technique and to utilize the PPA technique to reduce the number of the lines actually measured. If all other measurement parameters are retained, the measurement time of a blade is reduced relative to the measurement time of the blade in the conventional, non-accelerated PROPELLER technique. Combinations of the two alternatives are likewise possible: partial widening of the blade and partial reduction of the actually-measured lines.

Further advantages of the inventive PPA-PROPELLER method relative to the conventional PPA-PROPELLER method are:

4) Corresponding to the conventional Cartesian auto-calibration PPA, the additionally-measured coil calibration lines can also be used to improve the image quality overall.

5) Similar to as in the previously-described second technique for acquisition of the coil calibration data in the conventional PPA-PROPELLER technique and in contrast to the first technique, the inventive PPA-PROPELLER method requires no conventional, non-accelerated PROPELLER scan of its own placed for acquisition of the calibration data. The realization of the second technique for acquisition of the coil calibration data in the conventional PPA-PROPELLER technique is, however, difficult in practice and also theoretically only possible for limited acceleration factors.

In general the net acceleration of a PPA-PROPELLER method is defined as a PPA blade width divided by the blade width of a conventional PROPELLER technique given constant imaging parameters. It should be noted that the total number of the blades that is necessary in order to cover k-space with just these blades is indirectly proportional to the width of a single one of these blades.

The inventive PPA-PROPELLER technique, however, has a disadvantage, namely that the net acceleration of the inventive PPA-PROPELLER method is lower in comparison to conventional PPA-PROPELLER methods.

Whether the application of the inventive PPA-PROPELLER technique is reasonable or not in a particular application case therefore depends on how large the part of the blade is that must be completely sampled in order to acquire artifact-free images (in other words, whether a net acceleration of significantly more than 1 can be achieved).

Figure 6:
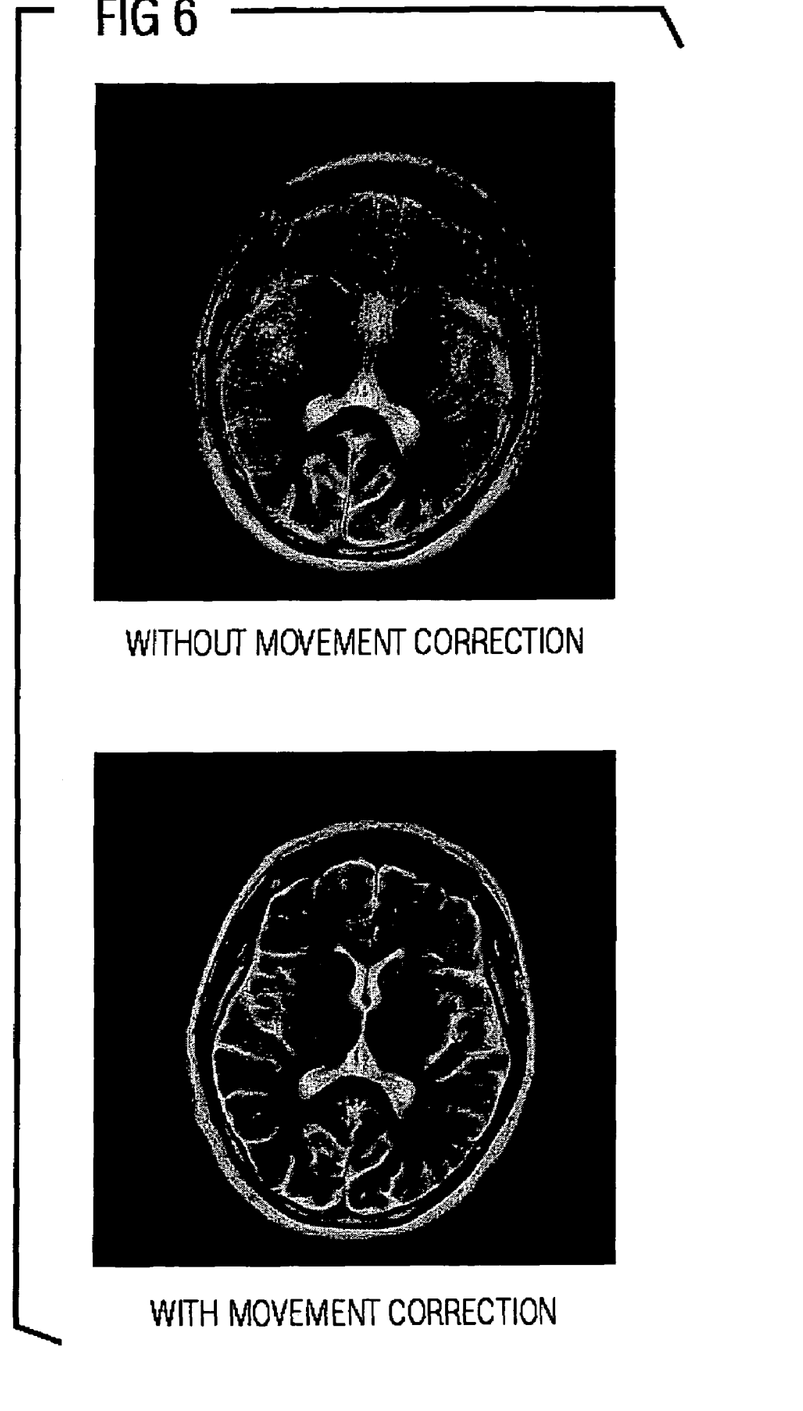
FIG. 6 is a comparison of two images that have been acquired according to the inventive method and have respectively been reconstructed without (left image) or, respectively, with (right image) movement correction.

The two depictions of a human brain that are shown in FIG. 6 were both acquired with the inventive PPA-PROPELLER technique. During the acquisition the subject was urged to move his head. For demonstration of this movement, the left image was then reconstructed without movement correction. The right image was calculated with movement correction.

In the example of FIG. 6 each blade was acquired with a single echo pulse train. After a single RF excitation pulse 35 refocusing pulses were thereby switched which in turn generated multiple progressively phase-coded spin echoes such that each second line of the blade was omitted with the exception of the middle 10 center-proximal k-space lines, which leads to a complete sampling of this central region. Overall this corresponds to a blade width of 60 lines (parallel k-space lines) and a net acceleration factor of $$\frac{60}{35} \approx 1.71.$$

It should be noted that the right image in FIG. 6 exhibits neither aliasing artifacts nor movement artifacts.

This clearly shows that the inventive PPA-PROPELLER technique can at least be reasonably used in TSE sequences or TSE-like sequences. It is likewise assumed that similar results can also be obtained with echo-planar sequences (EPI sequences) or fast gradient echo sequences, which is, however, still to be experimentally verified.

As already mentioned, the application of PPA techniques leads to an SNR signal-to-noise ratio) loss. The specific PPA technique used in the embodiment of the inventive method is GRAPPA.

In GRAPPA the signal $s_i(\vec{k})$ of coil i at each missing (not-sampled) k-space point $\vec{k}$ is represented as a linear combination of the points measured adjacent to this point $\vec{k}$:

$$s_i(\vec{k}) = \sum_{j=1}^{N_C} \sum_{\vec{q} \in \Omega} n_{i,\vec{k}}(j, \vec{q}) s_j(\vec{q}),$$

with j=1, ..., $N_c$ and $n_{i,\vec{k}}$ as linear weighting factors, with the first sum representing the component coils ($N_c$=number of the participating component coils), the second sum representing all data points measured in the neighborhood $\Omega_{\vec{k}}$ of $\vec{k}$, and $s_j(\vec{q})$ is the measured signal of the coil j at the sample point $\vec{q}$.

It is decisive that, given Cartesian sampling, the linear weighting factors are independent of $\vec{k} = (k_y, k_x)$ and therefore can be calculated form those coil calibration lines for which the $s_i(\vec{k})$ values of the above equation are known.

With a Cartesian neighborhood of $N_y \cdot N_x$ points, the number of the determined linear weighting factors per component coil is thus reduced to $N_{unknown} = N_c \cdot N_x \cdot N_y$. Each equation of the above linear equation system can now be written according to the following:

$$s_i(k_y, k_x) = \sum_{j=1}^{N_c} \sum_{l=0}^{N_y-1} \sum_{m=0}^{N_x-1} n_i(j, l, m) s_j\left(k_y + (Al - l_0)\Delta k_y, k_x + \left(m - \frac{N_x}{2}\right)\Delta k_x\right),$$

whereby $\Delta k_y$ represents the lattice constant in the phase coding direction, $\Delta k_x$ represents the lattice constant in the frequency coding direction, A is the acceleration factor and $l_0$ is selected such that all values of the right side of the equation have been measured and represent neighboring points of $s_i$.

The sought linear weighting factors $n_i(j, l, m)$ can be organized in a column vector $\vec{n}_i$, with each measurement point of the coil calibration data set as an element of the column vector $\vec{s}_i$ and the measured data points $s_j(\vec{q})$ are written as elements of a matrix G, the linear equation system can be written as $\vec{s}_i = G \vec{n}_i$ in matrix form. The problem (the determination of the linear weighting factors) is therewith reduced to the solution of a (generally) over-determined linear equation system.

In the combination of PPA with PROPELLER (PPA-PROPELLER), the measured data points of a single blade always come to line at grid points of a Cartesian grid. For this reason the GRAPPA reconstruction of a single blade is mathematically identical with a GRAPPA reconstruction of a conventional Cartesian grid. The single difference between conventional Cartesian sampling and PPA-PROPELLER is that in PPA-PROPELLER the calculation of the linear weighting factors must be specifically implemented for each blade.

Figure 2:
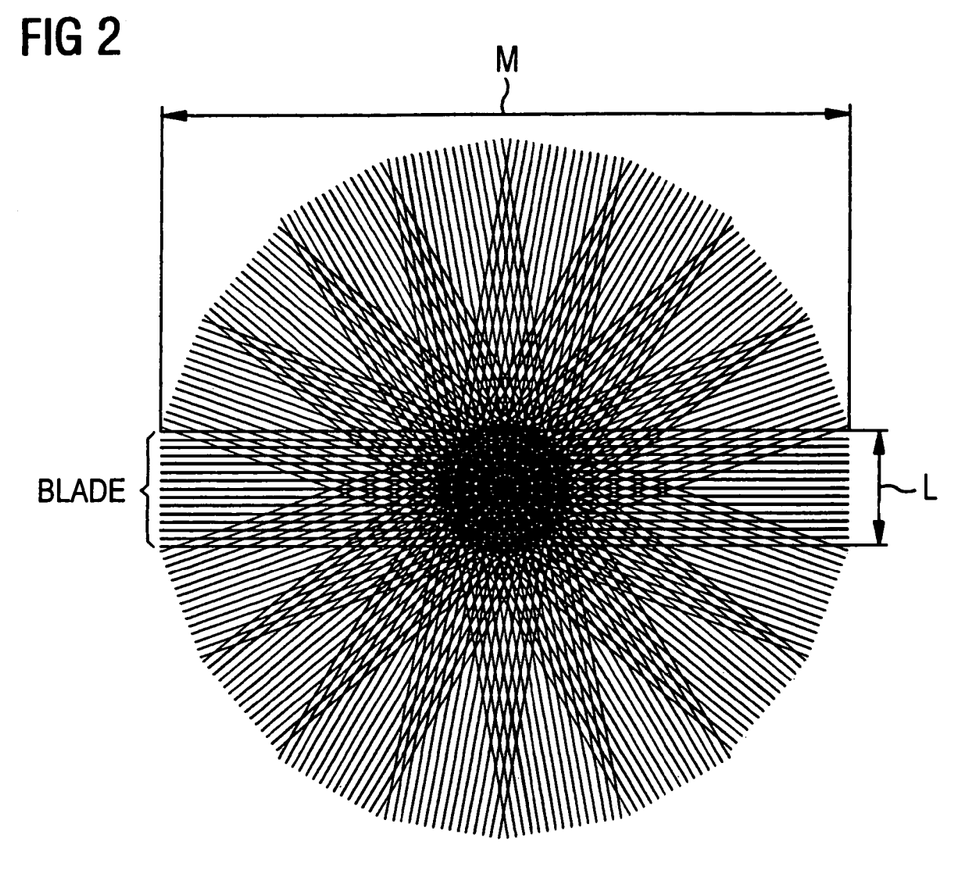
FIG. 2 schematically shows k-space sampling according to the PROPELLER technique with N=9 blades, with each blade exhibiting L=15 phase coding lines.

The number of the equations of the linear equation system (which corresponds to the number of lines of the matrix G) is at least the number of (extra measured) coil calibration lines times the number of the measurement points in the readout direction (M in FIG. 2). Additional equations (lines in the equation system) can frequently be added or, respectively, gained (dependent on how the coil calibration data were measured and depending on how many neighborhood values are taken into account).

This generally leads to an extremely over-determined linear equation system which, for example, can be solved in the sense of a minimal-norm method of the least squares. This means that as a solution an $\vec{n}_i$ must be found which minimizes the norm $\|G\vec{n}_i - \vec{s}_i\|$. The vector with the smallest norm $\|\vec{n}_i\|$ is additionally selected from all vectors $\vec{n}_i$ which minimize the norm just cited.

A number of solution methods exist in this regard, among which the known SVD method (singular-value decomposition), in particular in combination with strategies from regularization theory, represents a particularly robust method. The SVD method is described in detail in the relevant literature, so a description herein is not necessary and only the solution corresponding to the equation $\vec{s}_i = G\vec{n}_i$ is shown:

$$\vec{n}_i = \sum_{\substack{j=1 \\ \sigma_j \neq 0}}^{N_{unknowns}} \frac{\vec{u}_j^H \vec{s}_i}{\sigma_j} \vec{v}_j,$$

with $\vec{u}_j$ and $\vec{v}_j$ as respective left and right singular vectors; H designates the hermetic conjugate and the $\sigma_j$ are the singular values of the matrix G. The latter are non-negative real numbers in descending order:

$$\sigma_1 \geq \sigma_2 \geq \ldots \geq \sigma_{N_{unknowns}} \geq 0.$$

However, the value $$\frac{1}{\sigma_k}$$

is extremely high when the corresponding singular value $\sigma_k$ is very small, which is why small disruptions of the measured coil calibration data $\vec{s}_i$ lead to large fluctuations of the solution $\vec{n}_i$. Such a problem is known as an ill-posed problem.

Regularization theory supplies strategies as to how such SVD solutions can be stabilized. For this the regularization theory replaces the solution of the initial problem with an approximation solution which is insensitive to small disruptions of the input data. The above SVD solution is correspondingly modified as follows:

$$\vec{n}_i = \sum_{\substack{j=1 \\ \sigma_j \neq 0}}^{N_{unknowns}} f_j \frac{\vec{u}_j^H \vec{s}_i}{\sigma_j} \vec{v}_j,$$

wherein the values $f_j$ are filter factors and the following conditions must be satisfied:

a) $0 \leq f_j \leq 1$, $j = 1, \ldots, N_{unknowns}$, b) $f_j \to 1$, for $j \to 1$, c) $\frac{f_j}{\sigma_j} \to 0$, for $j \to N_{unknowns}$.

The conditions a) and b) ensure that the solution deviates little from the original solution while unstable terms (associated with the small singular values) are suppressed by the condition c).

The application of the regularization theory to the GRAPPA reconstruction is based on the assumption that such values in the solution that amplify the noise are linked with the small singular values. In the present invention the filter factors are selected as follows:

$$f_j = 0 \text{ in the event that } \frac{\sigma_j}{\sigma_1} < \mu, \text{ otherwise } f_j = 1.$$

Figure 7:
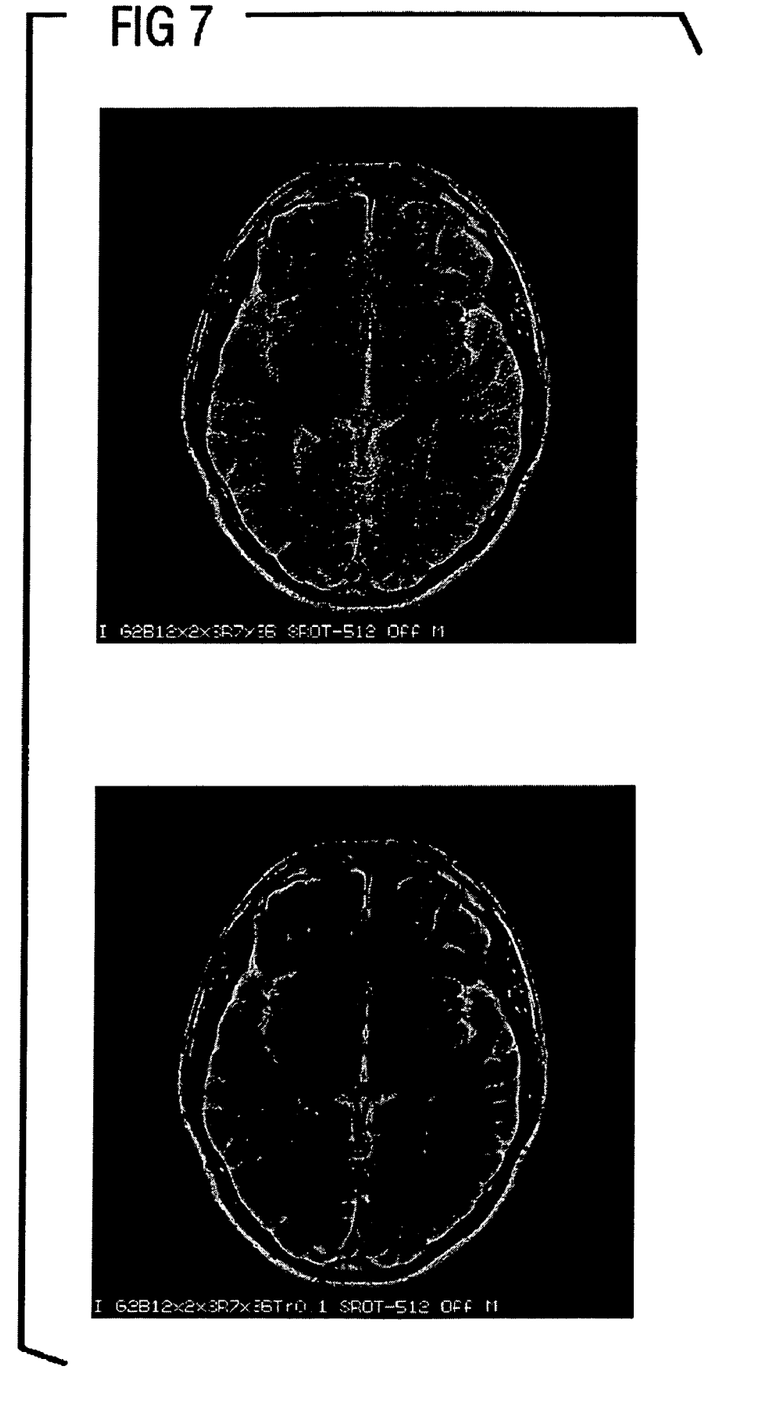
FIG. 7 is a comparison of two images that have been acquired according to the inventive method and have respectively been reconstructed without (left image) and with (right image) regularization.

The threshold parameter $\mu$ ($0 \leq \mu \leq 1$) allows the selection between "high noise suppression" (large $\mu$) and low information loss (small $\mu$). Both images in FIG. 7 should illustrate that. Both images were calculated from the same data set. The left image was not regularized (corresponding to $\mu=0$). The right image was correspondingly regularized with a threshold of $\mu=0.1$. It shows a clear gain in SNR.

However, cases can occur in which this type of filter parameter selection does not turn out to be optimal. For example, when the series of the singular values exhibits a gap between the singular value $\sigma_k$ and the singular value $\sigma_{k+1}$ (i.e. $\sigma_k \gg \sigma_{k+1}$), the following selection for $\mu$ would be more reasonable:

$$\mu = \frac{\sigma_k}{\sigma_1}.$$

Another selection possibility is known as the "Tikhonov regularization" with $$f_i = \frac{\sigma_i^2}{\sigma_i^2 + \tilde{\mu}^2}, i = 1, \ldots, N_{unknowns}, 0 \leq \tilde{\mu} \ll \sigma_1,$$

wherein the allocation of $\mu$ in turn enables the selection between "high noise suppression" and "low information loss".

It is assumed that this combination of SVD and regularization theory advantageously likewise increases the SNR given conventional Cartesian GRAPPA or even given non-Cartesian GRAPPA. However, an experimental test remains to be done. The markedly high robustness of SVD was already mentioned.

The disadvantage relative to earlier GRAPPA implementations is that the solution time given SVD can be slower than given other solution methods.

However, in the framework of the present invention two different methods can be used to reduce the reconstruction duration:

1. Reduction of the number of the equations of the linear equation system to be solved:

Sample values whose $k_x$-coordinate is greater than a predetermined maximum value $|k_x| > k_{max}$ are excluded (discarded) from the coil calibration data. The upper limit value $k_{max}$ is selected such that the linear equation system is at least over-determined. In the embodiment of the present invention a quadruple over-determination (meaning that the number of the equations is approximately four times the number of the unknowns) has proven to be advantageous.

2. Exclusion from the reconstruction of coil data from a coil that essentially contributes to the total signal only with noise.

This reduced $N_c$ and therewith the number of the unknowns of the linear equation system as well as the number of the equation systems to be solved. By a reduction of the number of the coil elements the speed of the PROPELLER reconstruction which is implemented after the PPA reconstruction is itself additionally increased. In order to determine from a specific blade the component coils that essentially deliver only a noise contribution, the following steps are implemented:

A) A simple correlation is implemented for each component coil:

$$cc_i = \sum_{k_y} \sum_{k_y} s_i^*(k_y, k_x) s_i(k_y, k_x),$$

wherein the sum counts over all measurement values which are associated with the completely-sampled central region of the blade (or a sub-region of this region) and the asterisk [star] designates the complex conjugation.

B) That component coil is identified which maximizes the correlation:

$$cc_{max} = \max_{i=1}^{N_c} cc_i.$$

C) When the correlation of a specific component coil fulfills the following inequality:

$$\sqrt{\frac{cc_i}{cc_{max}}} < \eta$$

this specific component coil is excluded from the reconstruction, whereby $\eta (0 \leq \eta \leq 1)$ represents an adjustable threshold parameter.

The methods A), B), C) just cited can be individually implemented at each blade or can even be implemented once for an allocated blade (for example the first measured) of the series. In the first case the method leads to the situation that in general the density compensation function (in the PROPELLER reconstruction following the PPA reconstruction) of each individual component coil must be selected different. In the second case the same component coils are excluded in all blades of the series.

In summary, it is noted that the solution of a linear equation system obtained via GRAPPA/GARSE can be inventively obtained with a combination of SVD methods and regularization theory without having to establish a sampling method (for example PROPELLER) defined by a specific k-space trajectory, which likewise leads to an improvement of the SNR in PPA-based magnetic resonance tomography imaging given use of the GRAPPA/GARSE reconstruction method.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for data acquisition and image reconstruction in magnetic resonance tomography using a plurality of reception coils to respectively receive magnetic resonance signals, said magnetic resonance signals being entered into k-space, said method comprising the steps of:

sampling the data in k-space with a plurality of blades each containing a plurality of k-space lines, by partially under-sampling at least one blade in said plurality of blades by regular omission of k space lines respectively at opposite boundary regions of each partial under-sampled blade, with regard to the phase-encoding direction of the blade such that only data in each A-th line of said boundary regions are acquired, with no omission of k space lines in a central region of the blade (with regard to the phase-encoding direction), to obtain at least one coil calibration line;

selecting a partial parallel acquisition (PPA) technique for completion of the respective blades and determining coil calibration data for the PPA reconstruction of a particular partial under-sampled blade from the central completely sampled region of said blade;

executing PPA reconstruction for the selected PPA technique, including interpolating the omitted k space lines of each blade;

accelerating said PPA reconstruction by executing a coil-exclusion algorithm that excludes signal contributions from respective coils in said plurality of coils, said algorithm excluding respective signal contributions that are not significant to said PPA reconstruction; and executing a PROPELLAR reconstruction after said PPA reconstruction.

2. A method as claimed in claim 1 comprising selecting said PPA technique from the group consisting of GRAPPA and PPA techniques derived from GRAPPA.

3. A method as claimed in claim 2 comprising selecting GARSE as said PPA technique.

4. A method as claimed in claim 2 comprising generating an optimized solution of a linear equation system defined by said selected PPA technique using a combination of SVD techniques and regularization theory.

5. A method as claimed in claim 1 wherein said algorithm comprises the steps of:

measuring a correlation $$cc_i = \sum_{k_y}\sum_{k_y} s_i^*(k_y, k_x) s_i(k_y, k_x)$$

for each coil, by summing the respective blade over all points of said completely-sampled region;

determining a coil that, of all correlation measurements according to $$cc_{max} = \max_{i=1}^{N_c} cc_i,$$

has the largest value, with $N_c$ as a coil count; and excluding contributions to said PPA reconstruction from any coil having a correlation measurement that satisfies $$\sqrt{\frac{cc_i}{cc_{max}}} < \eta,$$

wherein $\eta$ is an adjustable threshold and ($0 \leq \eta < 1$).

6. A method for data acquisition and image reconstruction in magnetic resonance tomography using a plurality of reception coils to respectively receive magnetic resonance signals, said magnetic resonance signals being entered into k-space, said method comprising the steps of:

sampling the data in k-space with a plurality of blades each containing a plurality of k-space lines, by partially under-sampling at least one blade in said plurality of blades by regular omission of k space lines respectively at opposite boundary regions of each partial under-sampled blade, with regard to the phase-encoding direction of the blade such that only data in each A-th line of said boundary regions are acquired, with no omission of k space lines in a central region of the blade (with regard to the phase-encoding direction), to obtain at least one coil calibration line;

selecting a partial parallel acquisition (PPA) technique, from the group consisting of GRAPPA and PPA techniques derived from GRAPPA, for completion of the respective blades and determining coil calibration data for the PPA reconstruction of a particular partial under-sampled blade from the central completely sampled region of said blade;

executing a PPA reconstruction for the selected PPA technique, including interpolating the omitted k space lines of each blade;

accelerating said PPA reconstruction by reducing a number of equations in a linear equation system of the selected PPA technique by excluding from said PPA reconstruction points in k-space having a magnitude that exceeds a predetermined threshold, and defining said predetermined threshold to cause said equation system to be at least over-determined; and executing a PROPELLAR reconstruction after said PPA reconstruction.

7. A method for improving the signal-to-noise ratio in magnetic resonance tomography based on partial parallel acquisition (PPA), comprising the steps of:

acquiring magnetic resonance data in a PPA technique using a plurality of reception coils;

reconstructing an image from the acquired magnetic resonance signals using a PPA reconstruction that requires solution of a linear equation system, selected from the group consisting of GRAPPA and GARSE;

solving said linear equation system using a combination of SVD techniques and regularization; and accelerating said PPA reconstruction by reducing a number of equations in a linear equation system of the selected PPA technique by excluding from said PPA reconstruction points in k-space having a magnitude that exceeds a predetermined threshold, and defining said predetermined threshold to cause said equation system to be at least over-determined.

8. A magnetic resonance tomography apparatus comprising:

a magnetic resonance scanner that interacts with a subject to obtain magnetic resonance data therefrom, said scanner comprising a plurality of individually operable RF reception coils;

a control unit that operates said scanner to enter said magnetic resonance data into a k-space memory; and a computer configured to sample the data in k-space with a plurality of blades each containing a plurality of k-space lines, by partially under-sampling at least one blade in said plurality of blades by regular omission of k-space lines respectively at opposite boundary regions of each partial under-sampled blade, with regard to the phase-encoding direction of the blade such that only data in each A-th line of said boundary regions are acquired, with no omission of k-space lines in a central region of the blade (with regard to the phase-encoding direction), to obtain at least one coil calibration line, using a partial parallel acquisition (PPA) technique, selected from the group consisting of GRAPPA and PPA techniques derived from GRAPPA, for completion of the respective blades and to determine coil calibration data for the PPA reconstruction of a particular partial under-sampled blade from the central completely sampled region of said blade, and to execute PPA reconstruction for the PPA technique, including interpolating the omitted k space lines of each blade, to accelerate said PPA reconstruction by reducing a number of equations in a linear equation system of the selected PPA technique by excluding from said PPA reconstruction points in k-space having a magnitude that exceeds a predetermined threshold, and defining said predetermined threshold to cause said equation system to be at least over-determined and to execute a PROPELLAR reconstruction after said PPA reconstruction to reconstruct an image of the subject.

9. A magnetic resonance tomography apparatus comprising:
a magnetic resonance scanner that interacts with a subject to obtain magnetic resonance data therefrom, said scanner and to acquire said magnetic resonance data in a PPA technique using said plurality of reception coils comprising a plurality of individually operable RE reception coils;
a control unit that operates said scanner to enter said magnetic resonance data into a k-space memory; and
a computer that reconstructs an image from the acquired magnetic resonance signals using a reconstruction technique that requires solution of a linear equation system, selected from the group consisting of GRAPPA and GARSE, and solves said linear equation system using a combination of SVD techniques and regularization theory and that accelerates said PPA reconstruction by reducing a number of equations in a linear equation system of the selected PPA technique by excluding from said PPA reconstruction points in k-space having a magnitude that exceeds a predetermined threshold, and defining said predetermined threshold to cause said equation system to be at least over-determined.

10. A computer-readable medium encoded with a data structure for data acquisition and image reconstruction in magnetic resonance tomography using a plurality of reception coils to respectively receive magnetic resonance signals, said magnetic resonance signals being entered into k-space, said medium being loadable into a computer system of a magnetic resonance tomography apparatus and causing said computer system to:
sample the data in k space with a plurality of blades each containing a plurality of k space lines, by partially under-sampling at least one blade in said plurality of blades by regular omission of k-space lines respectively at opposite boundary regions of each partial under-sampled blade, with regard to the phase-encoding direction of the blade such that only data in each A-th line of said boundary regions are acquired, with no omission of k-space lines in a central region of the blade (with regard to the phase-encoding direction), to obtain at least one coil calibration line;
select a partial parallel acquisition (PPA) technique, from the group consisting of GRAPPA and PPA techniques derived from GRAPPA, for completion of the respective blades and determining coil calibration data for the PPA reconstruction of a particular under-sampled blade from the central completely sampled region of said blade;
execute PPA reconstruction for the selected PPA technique, including interpolating the omitted k space lines of each blade;
accelerate said PPA reconstruction by reducing a number of equations in a linear equation system of the selected PPA technique by excluding from said PPA reconstruction points in k-space having a magnitude that exceeds a predetermined threshold, and defining said predetermined threshold to cause said equation system to be at least over-determined; and
execute a PROPELLAR reconstruction after said PPA reconstruction.

11. A computer-readable medium encoded with a data structure for improving the signal-to-noise ratio in magnetic resonance tomography based on partial parallel acquisition (PPA), medium being loadable into a computer system of a magnetic resonance tomography apparatus and causing said computer system to:
operate the apparatus to acquire magnetic resonance data in a PPA technique using a plurality of reception coils;
reconstruct an image from the acquired magnetic resonance signals using a PPA reconstruction that requires solution of a linear equation system, with a PPA reconstruction technique selected from the group consisting of GRAPPA and GARSE;
solve said linear equation system using a combination of SVD techniques and regularization theory; and
accelerate said PPA reconstruction by reducing a number of equations in a linear equation system of the selected PPA technique by excluding from said PPA reconstruction points in k-space having a magnitude that exceeds a predetermined threshold, and defining said predetermined threshold to cause said equation system to be at least over-determined.

12. A magnetic resonance tomography apparatus comprising:
a magnetic resonance scanner that interacts with a subject to obtain magnetic resonance data therefrom, said scanner comprising a plurality of individually operable RF reception coils;
a control unit that operates said scanner to enter said magnetic resonance data into a k-space memory; and
a computer configured to sample the data in k-space with a plurality of blades each containing a plurality of k-space lines, by partially under-sampling at least one blade in said plurality of blades by regular omission of k-space lines respectively at opposite boundary regions of each partial under-sampled blade, with regard to the phase-encoding direction of the blade such that only data in each A-th line of said boundary regions are acquired, with no omission of k-space lines in a central region of the blade (with regard to the phase-encoding direction), to obtain at least one coil calibration line, using a partial parallel acquisition (PPA) technique for completion of the respective blades and to determine coil calibration data for the PPA reconstruction of a particular partial under-sampled blade from the central completely sampled region of said blade, and to execute PPA reconstruction for the PPA technique, including interpolating the omitted k space lines of each blade to accelerate said PPA reconstruction by executing a coil-exclusion algorithm that excludes signal contributions from respective coils in said plurality of coils, said algorithm excluding respective signal contributions that are not significant to said PPA reconstruction, and to execute a PROPELLAR reconstruction after said PPA reconstruction to reconstruct an image of the subject.

13. A computer-readable medium encoded with a data structure for data acquisition and image reconstruction in magnetic resonance tomography using a plurality of reception coils to respectively receive magnetic resonance signals, said magnetic resonance signals being entered into k-space, said medium being loadable into a computer system of a magnetic resonance tomography apparatus and causing said computer system to:
sample the data in k space with a plurality of blades each containing a plurality of k space lines, by partially under-sampling at least one blade in said plurality of blades by regular omission of k-space lines respectively at opposite boundary regions of each partial under-sampled blade, with regard to the phase-encoding direction of the blade such that only data in each A-th line of said boundary regions are acquired, with no omission of k-space lines in a central region of the blade (with regard to the phase-encoding direction), to obtain at least one coil calibration line;
select a partial parallel acquisition (PPA) technique for completion of the respective blades and determining coil calibration data for the PPA reconstruction of a particular under-sampled blade from the central completely sampled region of said blade;

execute PPA reconstruction for the selected PPA technique, including interpolating the omitted k space lines of each blade;

accelerate said PPA reconstruction by executing a coil-exclusion algorithm that excludes signal contributions from respective coils in said plurality of coils, said algorithm excluding respective signal contributions that are not significant to said PPA reconstruction; and execute a PROPELLAR reconstruction after said PPA reconstruction.

* * * * *